United States Patent [19]
Volfson et al.

[11] Patent Number: 5,106,461
[45] Date of Patent: * Apr. 21, 1992

[54] HIGH-DENSITY, MULTI-LEVEL INTERCONNECTS, FLEX CIRCUITS, AND TAPE FOR TAB

[75] Inventors: David Volfson, Worcester; Stephen D. Senturia, Boston, both of Mass.

[73] Assignee: Massachusetts Institute of Technology, Cambridge, Mass.

[*] Notice: The portion of the term of this patent subsequent to Dec. 25, 2007 has been disclaimed.

[21] Appl. No.: 632,364

[22] Filed: Dec. 21, 1990

Related U.S. Application Data

[63] Continuation-in-part of Ser. No. 333,179, Apr. 4, 1989, Pat. No. 4,980,034.

[51] Int. Cl.⁵ ............................................. C25D 5/00
[52] U.S. Cl. .................................. 205/125; 437/195; 437/180
[58] Field of Search ............... 437/195, 189, 203, 915, 437/978, 180; 148/DIG. 50, DIG. 164

[56] References Cited

U.S. PATENT DOCUMENTS

| | | | |
|---|---|---|---|
| 3,868,724 | 2/1975 | Perrino | 357/65 |
| 4,064,552 | 12/1977 | Angelucci et al. | 361/414 |
| 4,141,782 | 2/1979 | Dugan et al. | 156/643 |
| 4,298,446 | 11/1981 | Ando et al. | 204/224 R |
| 4,380,042 | 4/1983 | Angelucci et al. | 361/421 |
| 4,386,116 | 5/1983 | Nair et al. | 437/189 |
| 4,411,719 | 10/1983 | Lindberg | 156/64 |
| 4,430,365 | 2/1984 | Schaible et al. | 427/96 |
| 4,470,874 | 9/1984 | Bartush et al. | 156/634 |
| 4,472,876 | 9/1984 | Nelson | 29/840 |
| 4,512,843 | 4/1985 | Miyazaki | 156/644 |
| 4,564,582 | 1/1986 | Miyazaki | 430/311 |
| 4,571,354 | 2/1986 | Maxwell | 428/78 |
| 4,617,193 | 10/1986 | Wu | 437/195 |
| 4,621,045 | 11/1986 | Goodner | 430/311 |
| 4,674,808 | 6/1987 | Phy | 439/108 |
| 4,705,606 | 11/1987 | Young et al. | 204/15 |
| 4,840,923 | 6/1989 | Flagello et al. | 437/195 |
| 4,840,924 | 6/1989 | Kinbara | 437/189 |
| 4,843,034 | 6/1989 | Herdon et al. | 437/189 |
| 4,902,637 | 2/1990 | Kondou et al. | 437/192 |
| 4,980,034 | 12/1990 | Volfson et al. | 437/195 |

OTHER PUBLICATIONS

Adams et al., "High Density Interconnect for Advanced VLSI Packaging", Suss Seminar Series, 1987, pp. 1–8.
Barrett, "High Definition Electroplated Copper Conductors on Silicon and Ceramic", IMC Proceedings, May 25–27, 1988, pp. 461–467.
Hatada et al., "New Film Carrier Assembly Technology: Transferred Bump TAB", IEEE, Sep. 1987, pp. 335–340.
Heikkila, "Precision Plating: A Fundamental Approach", Economics Laboratory, Inc.
Herrell, "I.C. Packaging Challenges", MCC Packaging/Interconnect Program, . . . , pp. 557–563.
Hoffman, "TAB Implementation and Trends", Solid State Technology, Jun. 1988.
Holzinger, "Advantages of a Floating Annular Ring in Three-Layer TAB Assembly", IEEE, Sep. 1987, pp. 332–334.

(List continued on next page.)

Primary Examiner—Brian E. Hearn
Assistant Examiner—Trung Dang
Attorney, Agent, or Firm—Wolf, Greenfield & Sacks

[57] ABSTRACT

A multi-layer interconnect structure of alternating dielectric (e.g., polyimide) and metal (e.g., copper) is built on a substrate supporting a continuous layer of metal. This metal layer is used as an electrode for plating vias through all the dielectric layers. Once the desired number of layers are formed, the substrate is removed and the continuous metal layer is patterned. Solid metal vias having nearly vertical side walls can be stacked vertically, producing good electrical and thermal transfer paths and permitting small, closely-spaced conductors. Further, by mixing geometrical shapes of conductors, a variety of useful structures can be achieved, such as controlled impedance transmission lines and multiconductor TAB tape with interconnects on tape of different dimensions than TAB fingers.

4 Claims, 8 Drawing Sheets

OTHER PUBLICATIONS

Jardine, "Worldwide Tape Automated Bonding Marketplace", Electroni-Cast Corporation, . . . , pp. 1-3.
Levinson et al., "High-Density Interconnects Wing Laser Lithography", G. E. Corp. Research and Development, pp. 1319-1327.
Meyer, "Product Applications for Tape Automated Bonding", New Technology Concepts, pp. 1-5.
Milosevic et al., "Polymide Enables High Lead Count TAB", Semiconductor International, Oct. 1988.
Nelson, "Success of GaAs Semiconductos Hinges on Packaging", Electronic Packaging & Production, Jun. 1985.
Neugebauer, "Multichip Module Designs for High Performance Application", G. E. Corp. Research & Development, pp. 401-413.
Pedder, "Flip Chip Solder Bonding for Microelectronic Applications", Hybrid Circuits, Jan. 1, 1988, pp. 3-7.
Poon et al., "High Density Multilevel Copper-Polyimide Interconnects," Microelectronics and Computer Tech. Corp., pp. 426-448.
Speilberger et al., "Silicon-on-Silicon Packaging", IEEE, Jun. 1984, pp. 193-196.
Jensen, "Polyamides as Interlayer Dielectrics for High Performance Interconnections of Integrated Circuits", Amer. Chem. Soc., 1987, 466-483.
Kelly, "Tape Automated Bonding: The Answer to VLSI Packaging Problem?", Electronica, 12th International Congress, Munich, Nov. 86.
Killam, "Development of Tape Automated Bonding for High Leadcount Integrated Circuits", National Semiconductor Corp., pp. 1-4.
Levi, "Tape Pak (TM)-A Novel Approach to Packaging", Electronica, 12th International Congress, Munich, Nov. 86.
Takiar, "TAB Technology-A Review", National Semiconductor Corp., pp. 1-3.
Uehara, "Trends in TAB Technology", AEU, 1988, pp. 39-44.
Vaz et al., "Effect of Bond Process Parameters on Aw/Aw Thermal Compression Tape Automated Bonding (TAB)", IEEE, 1987, pp. 22-23.
Rogers Corporation-Simpson, "The Area Array Connector, A Pinless Connection Technique for Pad Grid Array Packages", 1987.
Product Descriptions, Data Sheets and Bulletins.
Overheads from a presentation by David J. Arthur.

HIGH-DENSITY, MULTI-LEVEL INTERCONNECTS, FLEX CIRCUITS, AND TAPE FOR TAB

CROSS-REFERENCE TO RELATED APPLICATIONS

This application is a continuation in-part of application Ser. No. 07/333,179, filed Apr. 4, 1989 now U.S. Pat. No. 4,980,034.

FIELD OF THE INVENTION

This invention relates broadly to the field of high-density interconnections for integrated circuit packaging, flexible printed circuit boards and tape for tape-automated bonding (TAB), in general.

BACKGROUND OF THE INVENTION

Great needs have arisen in recent years for new technologies which can provide high-density, low-cost interconnections within and between integrated circuits and in other applications within electronic equipment. In response to the emergence of high lead-count LSI and VLSI integrated circuit devices, assembly technologies have been developed which are capable of making connections to up to about 200 input/output pads (I/O's) per chip using wire bonding techniques. However, wire bonding technology cannot cope with the even higher lead-counts which are already available or will soon become available, due, for example, to the problem of finite geometry of wire bonder tips. Other technologies, such as tape-automated bonding (TAB) thus have been receiving much attention for higher through-put and lower cost at high lead count and potential for higher densities.

Additionally, high-density interconnect modules are used for packaging multiple chips in a common package. Such structures contain multiple conductor levels separated by inter-level dielectrics. Vias between the levels provide conductive paths for transmitting signals from one conductor layer to another. The integrated circuits are connected to the high-density multi-layer interconnect modules by wire bonding, TAB, or flip chip area solder bump bonding.

Multi-chip packaging technologies are important, as they overcome a number of the size and performance limitations of single-chip packaging. Multi-chip packaging permits greater chip density and fewer external connections, resulting in improved reliability and delay time. The high interconnect density of multi-chip packaging, however, requires technology that can define high-resolution conductor patterns in multiple layers on relatively large substrates. Fine-line, multi-layer conductor patterns are required to interconnect the large number of I/O's on highly integrated circuits. Interconnections must be short and have well-controlled electrical characteristics, in order to propagate high-speed signals with minimum delay and distortion. Also, thermal considerations can become important, as it is necessary both to remove heat from chips and to match the coefficient of thermal expansion of chips and interconnection structures, to improve reliability of the package. Conventional single-chip packages have limited packing density on printed wiring boards and limit the system speed due to the large delay time for signals to propagate between chips. A number of technologies have been used or proposed for such multi-layer packaging. They are reviewed, for example, in R. J. Jensen, "Polyimides as Interlayer Dielectrics for High-Performance Interconnections of Integrated Circuits," chapter 40 in M. J. Bowden et al (eds.), *Polymers for High Technology Electronics and Photonics*, American Chemical Society, Washington, DC, 1987, at 466–483. A number of interconnect technologies have been developed based on copper conductors and polyimide dielectric, offering several advantages over other packaging technologies in meeting the various design needs for high-density, high-speed IC applications. Jensen also provides a partial review of chip attachment techniques. One of these techniques is tape automated bonding (TAB).

TAB technology was introduced a few decades ago as a chip attachment method for high volume applications. It was re introduced a few years ago to meet requirements for high lead-count and high-density LSI and VLSI packages. High capital cost has, however, limited the introduction of TAB technology into such assembly processes. Among the acknowledged problems are that fabrication involves many steps and is costly, and some fabrication technologies do not provide good thermal transfer characteristics. TAB technology has been developed, however, for consumer products produced in very large quantities, such as desktop calculators, watches, cameras, electronic thermometers, and thermal head drivers for facsimile machines. An excellent review of the state of TAB technology is contained, for example, in K. Uehara, "Focusing on Trends in TAB Technology," *AEU* No. 1, 1988, at 39–44.

Generally speaking, the prior art includes three categories of processes for fabricating multilayer interconnects for applications of the types discussed above. The three types of processes may be referred to as subtractive processes, semi additive processes and additive processes.

Subtractive processes may be understood from the following general description. First, a layer of metal is deposited on a substrate such as a silicon wafer. (The substrate may be an insulating material such as oxidized silicon, or it may be a conductor, in which case there may be an insulating coating on the back.) The metal layer is then patterned into wires, traces, and pad areas using conventional (lithographic) techniques. A dielectric layer is next deposited, following which vias are formed by removing the dielectric over the pads in the first metal layer and then depositing the second layer of metal, by sputtering or other methods. These vias, it should be noted, have side walls which are sloped away from the vertical by a substantial angle (e.g., thirty degrees). Next, the metal layer is patterned using subtractive techniques to remove the metal from unwanted locations leaving the second metal level circuitry and vias. The metal layer may be used as the foundation for another level of interconnect, with the process of building layers being repeated any number of times. Some of the disadvantages of this type of structure are: (1) the sloping sides of the vias cause more area to be allocated to vias than is necessary for their functioning; (2) vias cannot be stacked vertically and may have to be laterally offset, requiring more area and reducing heat transfer through the vias; (3) lateral via offset extends the conductive path; and (4) the design rules become quite complex.

Semi-additive processing begins with the deposition of a continuous layer of metal on a substrate. A temporary mask of a dielectric, photoresist, or other suitable material, is applied to the metal. The mask next is patterned and openings are formed where vias are desired. Using the metal layer as a cathode, vias are then electroplated into the openings. The plating mask is then removed. At this juncture, the bottom metal layer is patterned and a dielectric overcoat is applied. Of course, the structure is not yet usable since the vias have not been connected to a next layer of conductors. A variety of approaches have been used for completing the processing. One approach is to mechanically polish off the dielectric overcoat to expose the tops of the vias and to planarize the surface, as described in S. Poon, J. T. Pan, T-C. Wang and B. Nelson, "High Density Multilevel Copper-Polyimide Interconnects," *Proceedings of NEPCON West '89*, March 1989, at 426–448. A second metal layer can then be deposited and the process can be repeated to build a desired conductor pattern on the second layer, with connection through the first level vias to the bottom conductor layer and with connection through a second level of vias to a third level of conductor. The technique obviously can be extended to produce additional levels.

Semi additive processing thus produces vias with nearly straight side walls allowing, in principle, higher interconnect density than for subtractive processing. It also allows the building of stacked up vias, resulting in shorter conductive paths and, possibly, thermal vias for heat dissipation. Further, the uniformity of the electroplating is easy to control. However, semi-additive processing involves many steps and requires a planarization/process to expose vias and is therefore slow and costly.

The so-called additive processes do not require a temporary plating mask to form vias, as described, for example, in A. C. Adams et al, "High Density Interconnect for Advanced VLSI Packaging," *Electrochemical Society Abstracts*, Vol. 171, Spring 1987. Vias are plated by electroless techniques in the dielectric. For example, vias are formed in the masked openings by chemical deposition or growth techniques based on use of, for example, nickel as the material for the vias. These vias are solid and have sidewalls that are quite straight and vertical. Though having all the advantages of the semi-additive process, and fewer processing steps, the via uniformity in the electroless process is difficult to control and limits acceptance of these techniques.

These various prior art techniques all have been useful for interconnect manufacturing, but for TAB tape they have thus far been able to yield in production minimum finger spacing of no less than about 50 $\mu$ and finger widths of no less than about 50 $\mu$. These specifications limit the interconnection density of chips and will not be suitable for future generations of chips having one thousand I/O's or more.

Accordingly, it is an object of the present invention to provide an improved multi-layer interconnect structure and method of fabricating same.

It is another object of the invention to provide an improved method for fabricating a flex circuit.

Another object of the invention is to provide a method for making a multi-layer interconnect structure in a TAB tape.

Still another object of the invention is to provide a method for making a multi-layer interconnect structure using smaller inter-conductor line spacings and smaller conductor dimensions than has previously been available for TAB.

Yet another object of the invention is to provide a multi-layer interconnect structure adapted to area bonding techniques.

Another object of the invention is to provide a multi-layer interconnect structure and method of making same, wherein the structure can include a mixture of conductor geometries.

A still further object of the invention is to provide a multi-layer interconnect structure, and method for making same, wherein efficient thermal transfer through the layers can be effected by thermal vias.

SUMMARY OF THE INVENTION

The foregoing and other objects and advantages are achieved using an "upside-down" process that may be viewed as a modified semi additive process. According to this modification, a multi-layer interconnect structure is built on a substrate supporting a continuous layer of metal. This metal layer is used as an electrode for plating vias through all the dielectric layers. Once the desired number of layers are formed, the substrate is removed and the continuous metal layer is patterned.

In greater detail, a single interconnect layer is formed of three sub layers: a first (or bottom) protective layer of, for example, chromium about 500 angstroms thick; a middle continuous layer of conductor, such as a layer of copper about 5000 angstroms to 5 $\mu$ thick; and a second (or top) protective layer of chromium (also about 500 angstroms thick). Other suitable materials may, of course, be substituted and the protective (sub)layers may be omitted in their entireties for some choices of the conductor material. A first such interconnect layer is applied onto a substrate, such as silicon. (This first interconnect layer will eventually become the top conductor layer and/or bonding pads.) A layer of dielectric (e.g., polyimide) is then applied. Openings for vias are etched in the dielectric and in the second (i.e., top) protective layer. Using the first (continuous) layer of copper conductor as an electrode, copper via posts are then electrolytically plated in the openings. Subsequent conductors are isolated in-plane, but are electrically connected to the bottom conductor through vias. Through successive deposition of interconnect layers and dielectric, and formation of vias as outlined above (all using the first conductive layer as a plating electrode), a multilayer interconnect structure is formed. Finally, the interconnect is released from the substrate, such as by chemically etching away the substrate, effectively turned upside down (though that is not a physical necessity) and the first layer of copper conductor is patterned. This forms a flex circuit.

Some choices of material for the conductor layers will not require one or both protective layers. When copper is used for the conductor layer, the first protective layer guards against oxidation of the copper where conductor is to be retained after the etching process. The second protective layer shields the copper, obviates diffusion of the copper into the dieletric and facilitates bonding to the polyimide dielectric.

Optionally, the interconnect structure can be bonded to another substrate either prior to or after the removal of the temporary substrate—for example, to use the structure for a chip mount.

Advantages are obtained from the ability to control the thickness of each conductor, trace and dielectric layer, and from the use of a process which allows all vias to be electrolytically plated of copper. Considerable versatility is achieved and very small, closely-spaced structures can be formed alongside large structures. Through the use of thin metal traces, low inductance signal lines are possible. Thin dielectric layers allow ground planes to be close to the signal lines, reducing cross-talk. Controlled impedances can be achieved both for small conductors and for large conductors, in both uniform and mixed geometries. Thick TAB fingers can be formed in the same structure, and even on the same layer, as thin signal traces and other structures.

An example is shown for using the foregoing process in a TAB application to form a mixed-geometry structure. In the mixed geometry structure illustrated below, for example, a stripline signal trace having a 5 micron by 16 micron cross-section is formed in the same structure as TAB leads of 50 micron by 35 micron cross-section, the latter being the smallest size for a typical TAB finger using the conventional prior art. This particular geometry with the dielectric thickness of 45 $\mu$ and polyimide dielectric with a dielectric constant of about 3.5 allows for 50 ohm impedance signal lines. Therefore, controlled impedance lines can be built by shrinking the signal trace dimensions inside a polyimide matrix yet maintaining a reasonable total TAB tape thickness to facilitate etching of the polyimide by plasma processing or other suitable techniques.

The advantages and various other objects and features of the invention, as well as its practice, will be more fully understood from the detailed description below, which should be read in conjunction with the accompanying drawing.

BRIEF DESCRIPTION OF THE DRAWING

In the drawing:

FIG. 6 is a diagrammatic illustration of an exemplary structure manufactured using the method of FIGS. 4A-4F.

DETAILED DESCRIPTION

Figure 1A:
FIGS. 1A-1G are diagrammatic illustrations showing an exemplary series of process steps for making a high-density multi-level interconnect, flex circuit or mixed-geometry structure according to the present invention, and the article produced thereby.
Figure 1B:
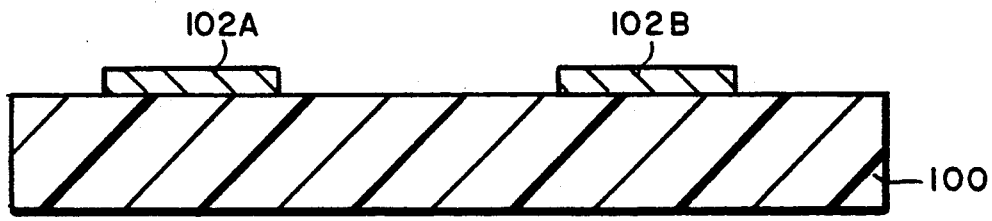

Reference is now made to FIGS. 1A-1G which show an exemplary series of process steps for making a high-density multi-level interconnect, flex circuit, or mixed-geometry structure according to the present invention. As shown in FIG. 1A, the process starts with a substrate material, such as a wafer of silicon 100. The substrate 100 may, as stated above, be covered with a thin (e.g., 500 angstrom) protective layer 102 of a material such as chromium, which can protect copper from oxidation (the protective layer may be omitted if a different material is used, such as aluminum). If the substrate has a rough surface, the thickness of the layer 102 should be increased, to ensure the presence of a continuous metal surface. The protective layer 102 may at this time be patterned by plasma etching or other appropriate means, leaving the portions 102A and 102B (FIG. 1B); this patterning allows the protective layer to be used as a mask in the later stages of the processing, as further explained below. Alternatively, the protective layer may be patterned at a later stage.

Figure 1C:
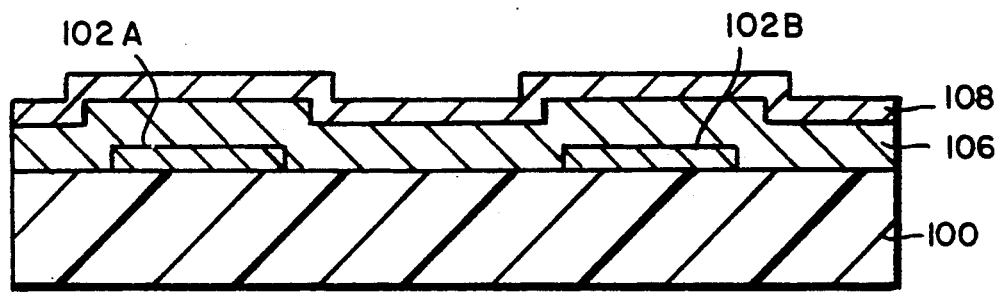

Turning to FIG. 1C, a continuous layer 106 of metal, preferably copper, is deposited over the protective layer. A typical thickness for the copper is about 5 $\mu$. The metal layer is then, if desired, covered by a deposited layer of a protective overcoat material 108, such as another 500 angstrom layer of chromium.

Figure 1D:
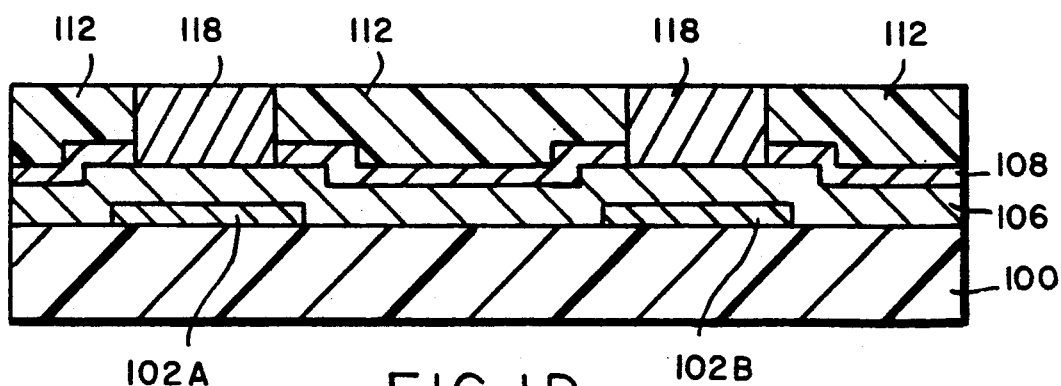

Next, a layer of dielectric 112 is formed or applied, as depicted in FIG. 1D. The dielectric preferably is a planarizing layer such as polyimide, which is spun and cured to form a layer about 20-25 microns thick. Using photolithographic techniques, for example, openings are etched in the dielectric 112 and in the protective overcoat 108 for formation of vias by plasma etching, RIE (reactive ion etching), use of a liquid etchant, or other suitable means.

Using the metal layer 106 as a cathode, via posts 118 (see FIG. 1D) are electrolytically plated in the openings which had been created for them. This, it will be seen, allows the formation of copper via posts having nearly vertical sidewalls. By controlling the current in the plating electrodes, and the agitation of the plating solution, good uniformity of via plating can be achieved.

Figure 1E:
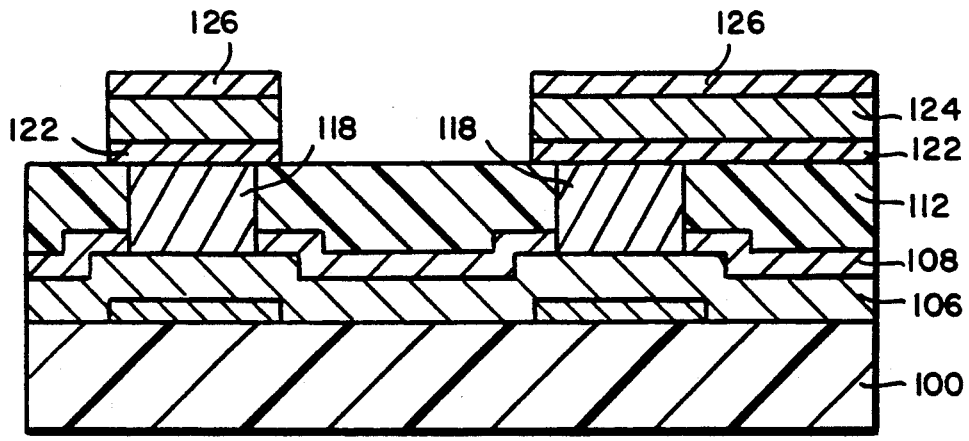
Figure 1F:
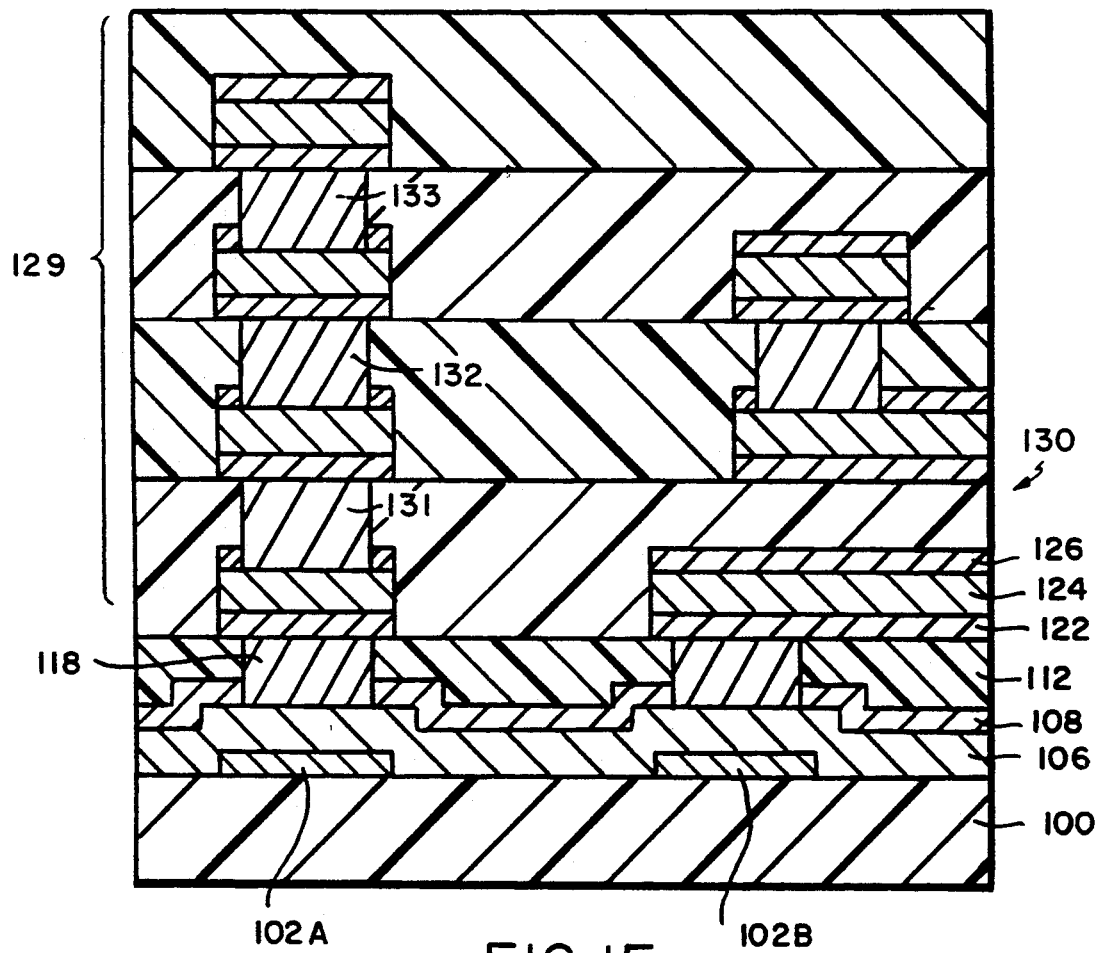

To add the next level to the structure, a second bottom protective layer 122 (e.g., chromium), second conductive layer 124 (preferably copper) and second top protective layer 126 (e.g., chromium) are deposited and patterned, as shown in FIG. 1E; of course, the protective layers may be unnecessary and, if so, need not be used. The second level conductors are electrically connected through the bottom electrode. Still more layers can be built up by repeating the techniques of FIGS. 1D-1E, to produce a structure such as the example 130 illustrated in FIG. 1F. As seen there, vias may be stacked vertically, producing a very short electrical and thermal path. Each time vias are plated, the "top" metal layer 106 acts as the plating electrode; it is continuous and is in direct electrical contact with all vias that are created.

Figure 1G:
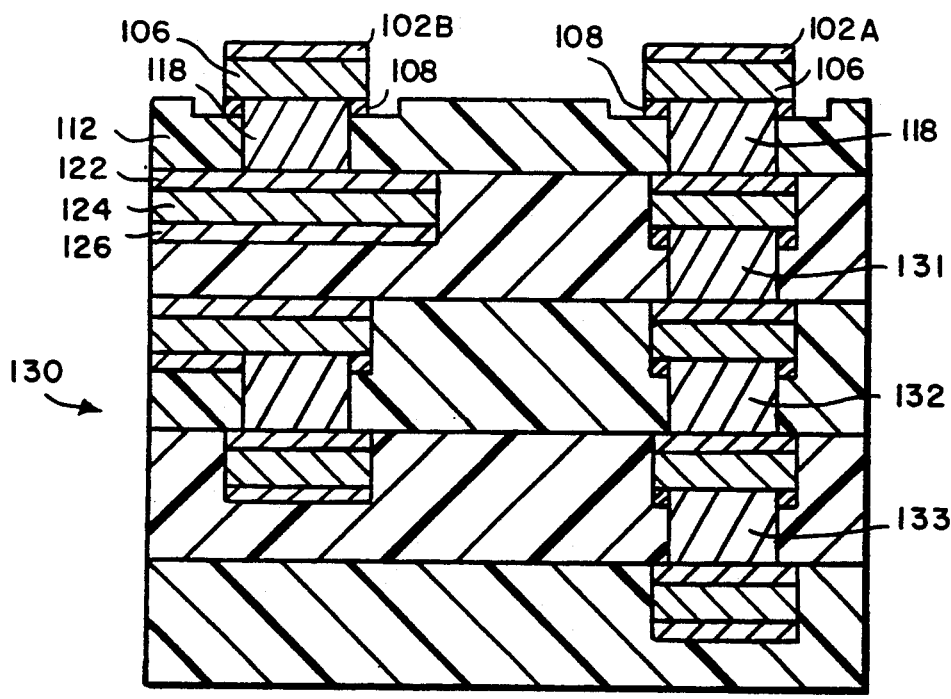

At this point, the multilayer interconnect can be released from the substrate. This may be done by etching away the substrate either chemically or using plasma etching or other techniques. Once the substrate is removed, if the protective layer 102 had earlier been patterned, the metal layers 106 and 108 are etched away in the exposed areas; otherwise, the protective layer 102 is patterned and the metal layers 106 and 108 are then etched. This removes the electrical contact between all the vias and creates separate electrical paths conforming to the patterning of the various layers of conductors and the inter-layer connections made by the vias. The resulting article is shown in FIG. 1G, where it has been turned upside down relative to FIGS. 1A-1F. As depicted, the article is now a flex circuit.

Figure 2:
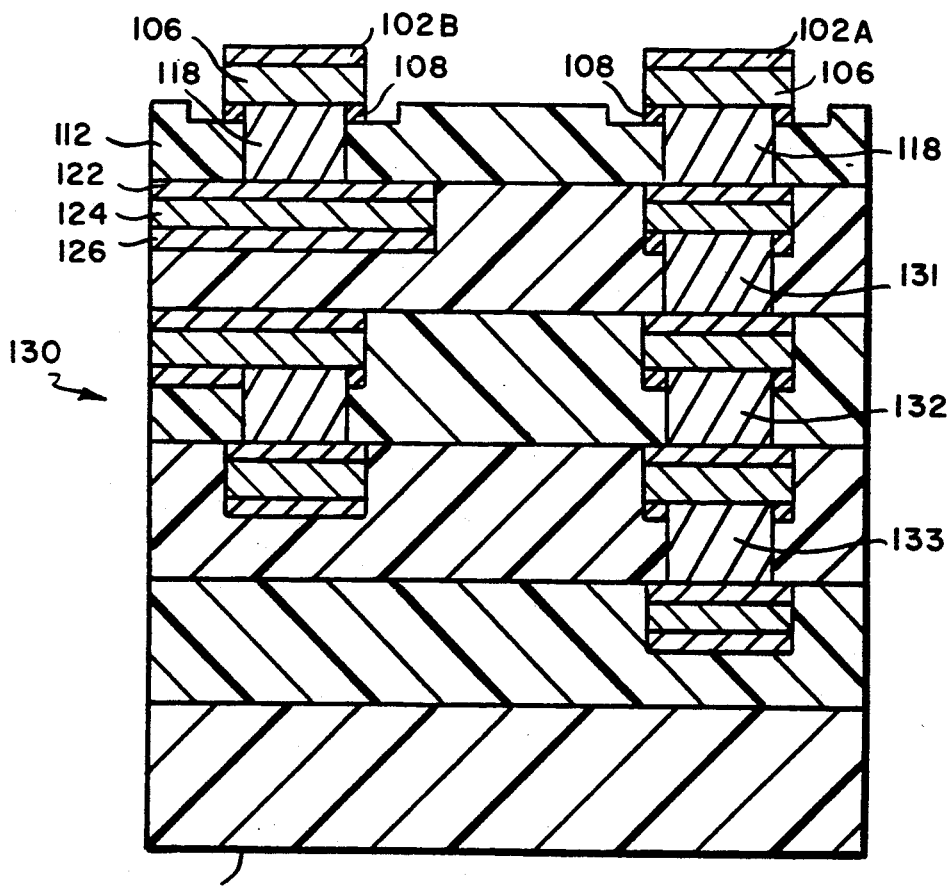
FIG. 2 is a diagrammatic illustration of a structure produced according to the process of FIGS. 1A-1G and then mounted on a new substrate, such as for use as a chip carrier.

Optionally, the structure may be bonded to another substrate 140, as shown in FIG. 2, before or after the original substrate is released, for either temporary or permanent use. This variation is useful for forming a multilayer chip carrier, in particular.

The foregoing method may be varied in many ways without departing from the spirit and scope of the invention. For example, a so called "release" layer may be applied to the substrate before the first protective layer is formed. The release layer comprises a composition which can easily be dissolved to separate the interconnect structure from the substrate, avoiding the need to etch away the substrate. Further, the protective layers, if used, may be of differing materials (e.g., the top protective layers may be titanium or another material, to facilitate selective etching).

Moreover, while the process described above is useful for flex circuits in general, it is also particularly useful both for conventional TAB and for structures employing a mixture of conductor geometries, some of which are conventional TAB elements. The combination of the use of additive (e.g., plating) techniques and plasma etching makes possible the manufacture of TAB tape with mixed-geometry structures with conductor spacings of 100 $\mu$ or less and conductor thickness of 50 $\mu$ or less, and with TAB fingers and spaces of 50 $\mu$ or less. For example, 7 $\mu$ wide conductors 5 $\mu$ high and 10 $\mu$ by 10 ° vias 20° high have been produced.

Turning to FIGS. 3A–3K, a method is shown for fabricating such multilayer interconnect structures. The method starts with a substrate 200 to which there are applied in succession a layer of chromium 202 of about 500 angstroms thickness, a layer of copper 204 of about 5000 angstroms thickness, and a layer of titanium 206 of about 500 angstroms thickness. (The layers 202 and 206 may be of the same material, though different materials are used in this example, to allow selective etching of the layers.)

If the desired product is tape for TAB or any other structure requiring openings in the dieletric, the pattern of the openings is etched in the titanium 206 and the copper 204 as follows: A layer of photoresist 208 of about 1–1.5 $\mu$ is applied on top of the titanium 206. See FIG. 3A. Next, the photoresist 208 is patterned, to define areas for sprocket holes, personality windows, or other openings in the dielectric. The titanium and the copper are then etched away in the defined areas and the photoresist is removed by plasma etching or any other suitable method. This yields a structure such as the one shown in FIG. 3B, that will later define an opening in the dielectric at 212. If the openings in the dielectric are not desired, the steps in this paragraph can be skipped.

Figure 3A:
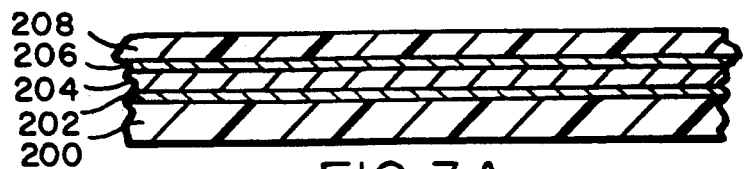
FIGS. 3A-3K are diagrammatic illustrations showing a second exemplary series of process steps for making a high-density multi-level interconnect according to the present invention, and the article produced thereby, particularly for use where the article is to be a mixed-geometry structure.
Figure 3B:
Figure 3C:
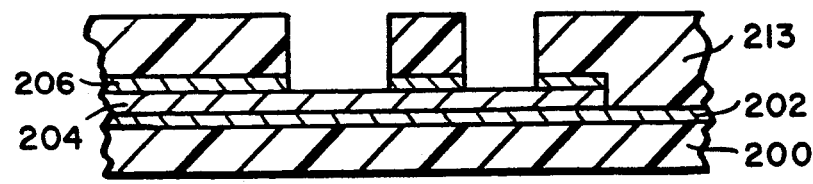

A thick layer 213 of photoresist (e.g., 7-8 microns) is applied over the structure at this point. It is patterned photolithographically with the bottom layer circuitry pattern and the upper layer of titanium is etched as desired, exposing the copper. (FIG. 3C.) Using the copper layer 204 as an electrode, a layer of copper 214, about 5 microns thick (for example), is then electroplated through the photoresist mask and the photoresist is removed. This yields the structure of FIG. 3D. Optionally, at this point (or at other appropriate points in the process), a thin protective layer of, for example, nickel (not shown) may be deposited over the traces. The electroplated copper layer 214 can contain pads for IC bonding or be a ground layer, power layer or a signal transmission layer.

Figure 3D:
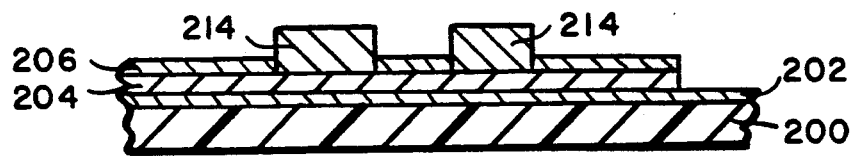
Figure 3E:
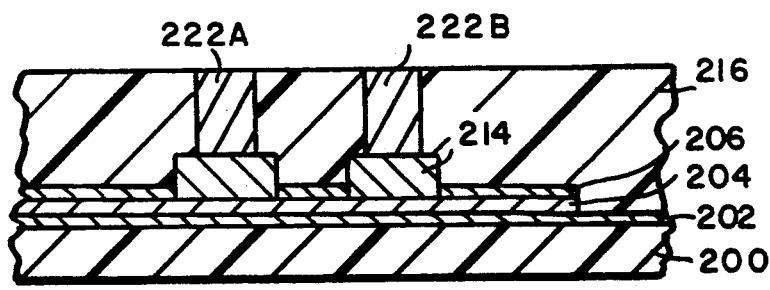

Onto the structure of FIG. 3D, a layer 216 of polyimide about 20–25 microns thick is applied. A layer of aluminum (not shown) about 4000 angstroms thick is deposited onto the polyimide and patterned to define openings for vias by plasma etching, RIE (reactive ion etching), use of a liquid etchant, or other suitable means. Using the aluminum as a mask, the polyimide is etched to open holes for vias. A photosensitive dielectric can be used and the vias can be defined by photolithography so that the aluminum deposition step, patterning and polyimide etch steps are avoided. The aluminum is then removed and the exposed copper is cleaned to remove any copper oxide. Next, using the first copper layer 204 as an electrode, copper vias 222A and 222B are then electroplated into the openings, producing the structure of FIG. 3E.

After using a backetch to remove the oxides from the via tops and to roughen the surface of the dielectric, layers of chromium, copper and titanium, respectively labelled 224, 226 and 228 are successively deposited, for example, by sputtering. As with layers 202, 204 and 206, the chromium and titanium may be about 500 angstroms thick and the copper, about 5000 angstroms thick. A thick layer 232 of photoresist of about 8 $\mu$ is applied, like layer 213, and it is patterned with the second level circuitry layout, providing the intermediate structure of FIG. 3F. The upper layer 228 of titanium is etched through openings in the photoresist and, using copper layer 226 as an electrode, a copper trace 234 of about 5 microns thickness is electroplated. FIG. 3G. (Electroless plating techniques may be used instead, if desired.) The photoresist 232 is then removed; the layers 224, 226 and 228 are etched where exposed; and a polyimide coat 240 is applied. The second level traces are still electrically connected through the bottom metal layer 204. A layer of aluminum (not shown) of 4000 angstrom thickness is deposited onto the polyimide and patterned to define openings for vias. As for the previous via layer, the vias in the polyimide are etched using the aluminum mask. The aluminum is then removed and the exposed copper is cleaned to remove any copper oxides. Next, using the first copper layer 204 as an electrode, copper vias 236 and 238 are electroplated. This produces the two-conductor structure of FIG. 3H. Thus, both via levels are electroplated using the sam underlying electrode.

Proceeding, another triad of chromium/copper/ titanium layers 242, 244, and 246 of like thicknesses as layers 224, 226 and 228, are formed by backetching and sputtering. FIG. 3I. Additional layers of conductors and vias can similarly be added using the same underlying electrode for plating vias. In some cases, the design may include non-functional or redundant lower level vias to provide a better contact during plating of the upper level vias.

The structure of FIG. 3I can now be used for different purposes. For example, to produce a high density multi-layer, multi-chip module, a third layer of traces can be plated using the same procedures as were used to form traces 234. The resulting structure can then be bonded to a permanent substrate and the temporary silicon substrate is removed by etching, as was done in FIG. 2. Then the thin, sputtered chromium 202, copper 204, and titanium 206 layers are etched, exposing the bottom layer plated copper 214. This is not separately illustrated, to avoid redundancy with FIG. 2.

Alternatively, a thick layer 248 of photoresist of about 30 $\mu$ may be applied to the structure of FIG. 3I, and it is patterned with the third level circuitry layout. Next, TAB fingers 252 of about 25 microns thickness, and the upper layer circuitry and power and ground planes 253, are electroplated through the photoresist mask, using layer 244 as an electrode. The structure is now as shown in FIG. 3J. The photoresist 248 is then removed.

Though FIG. 3J shows the traces 253 and TAB fingers 252 to be of the same thickness, it will be appreciated that with multiple photoresist applications, conductors of different thicknesses may be formed.

The silicon substrate 200 is etched from the back, exposing chromium layer 202. In turn, chromium layer 202 is etched away. In the areas to be opened for sprocket holes and personality windows, the polyimide is then removed by plasma etching or another suitable method. The titanium layer 246, the exposed parts of the copper layer 244 and chromium layer 242 are etched off. The sputtered copper layer 204 and titanium layer 206 are etched off the bottom of the structure (FIG. 3K). In the process, the exposed portion of copper 244 is also removed.

Figure 4A:
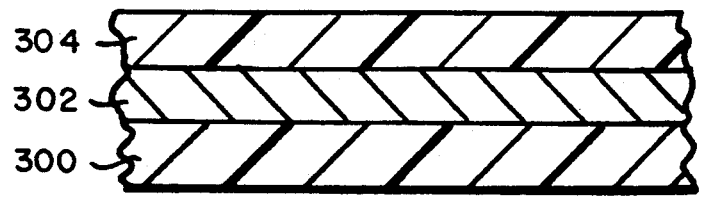
FIGS. 4A-4F are diagrammatic illustrations of a third exemplary series of process steps according to the present invention.
Figure 4B:
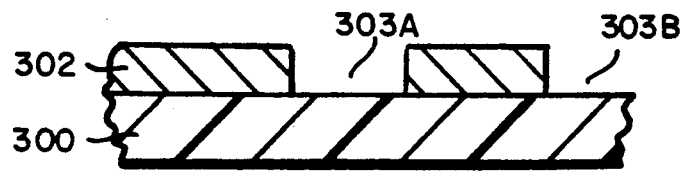
Figure 4C:
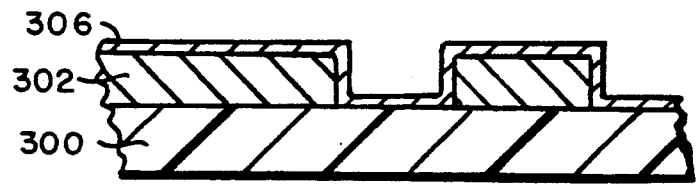
Figure 4D:
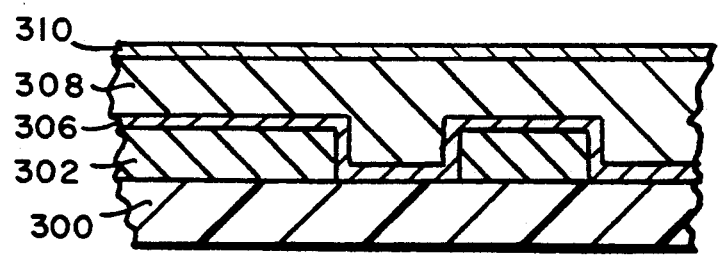

Turning now to FIGS. 4A-4F, still another sequence is shown for fabricating such multi-layer interconnect structures according to the present invention. On a substrate 300, a layer 302 of chromium approximately 2500 angstroms thick is sputtered. A layer of photo resist 304 is applied on top of the chromium 302. See FIG. 4A. Next, the photoresist 304 is patterned to define areas in which the chromium is to be removed. The chromium is then selectively etched away in the defined areas (e.g., 303A, 303B) and the photoresist is removed by plasma etching or any suitable method, yielding the structure shown in FIG. 4B. A thin layer of chromium 306 approximately 200 angstroms thick is then sputtered over the surface. This will facilitate adhesion of the next layer. The structure is now as indicated in FIG. 4C. A one $\mu$ thick layer of copper 308 is deposited next. A 1000 angstrom thick layer of chromium 310 is, in turn, sputtered over the copper layer 308. This results in the structure of FIG. 4D. The copper layer 308 is continuous and will serve as a plating electrode, allowing uniform plating of vias throughout the TAB tape on the tape edges as well as on the ground plane.

Figure 4E:
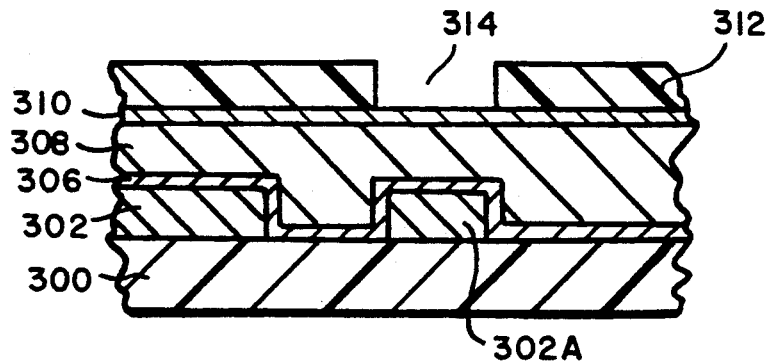

Next, a thick layer of photoresist 312 is applied and patterned, and a layer 310 is etched forming openings such as 314, as shown in FIG. 4E.

Figure 3F:
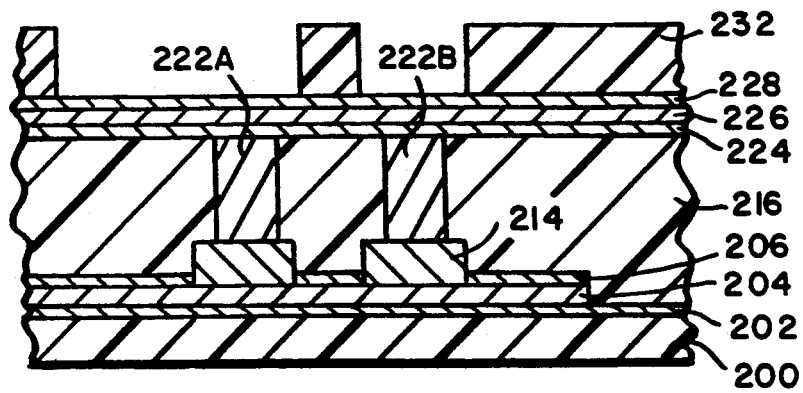
Figure 3G:
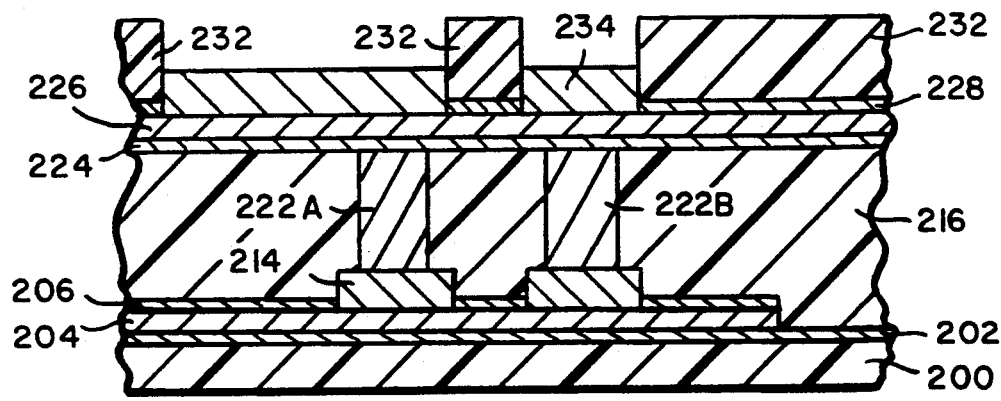
Figure 3H:
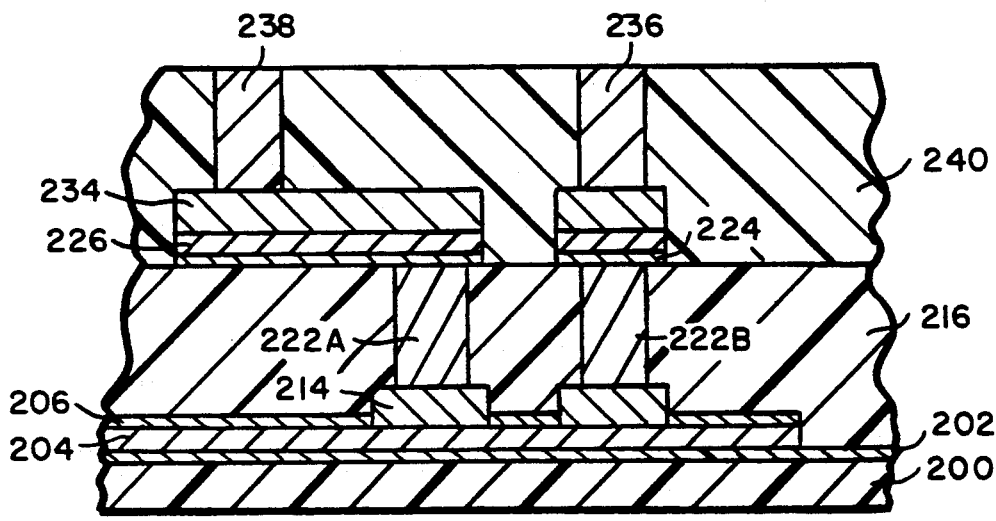
Figure 3I:
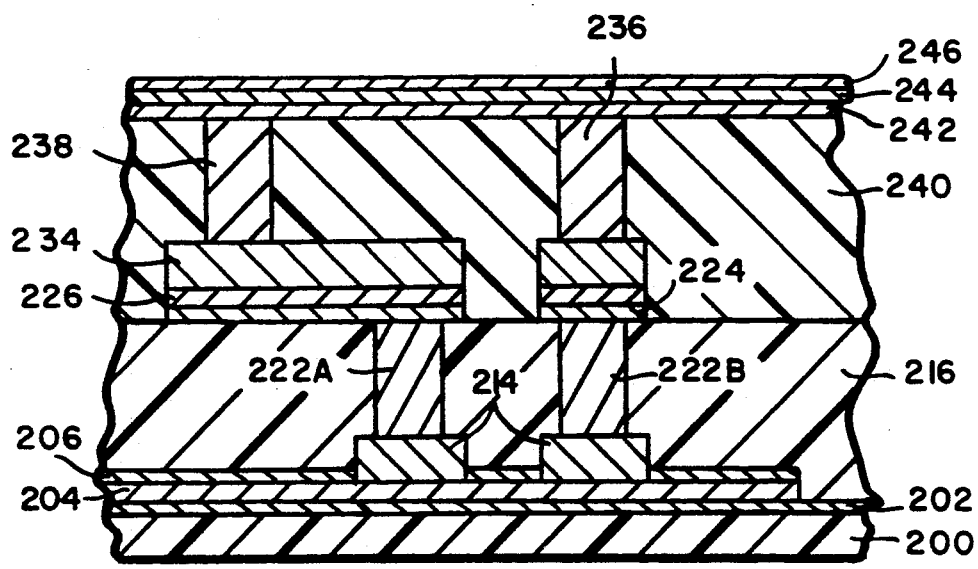
Figure 3J:
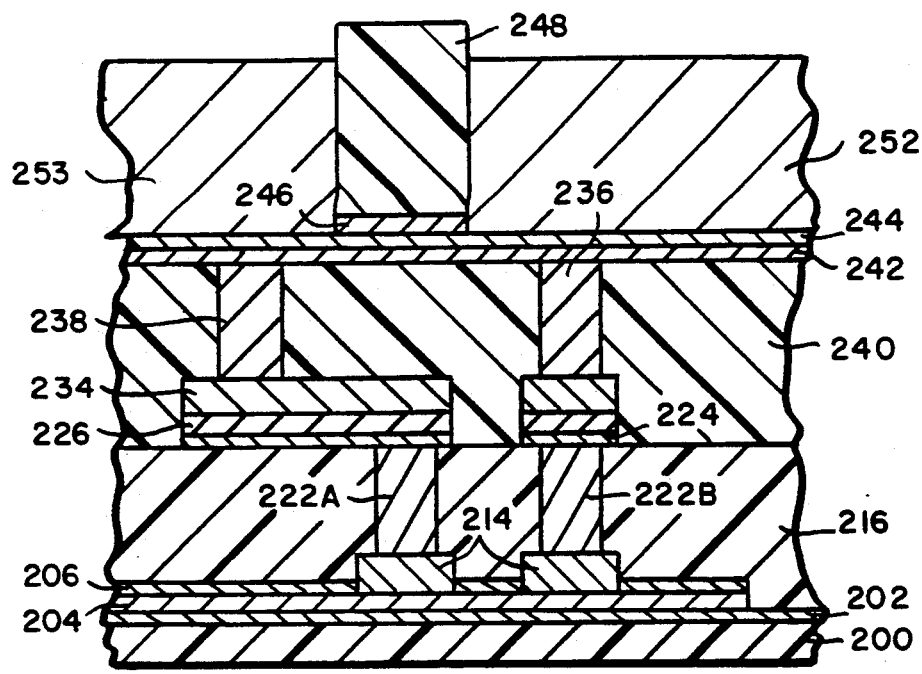
Figure 3K:
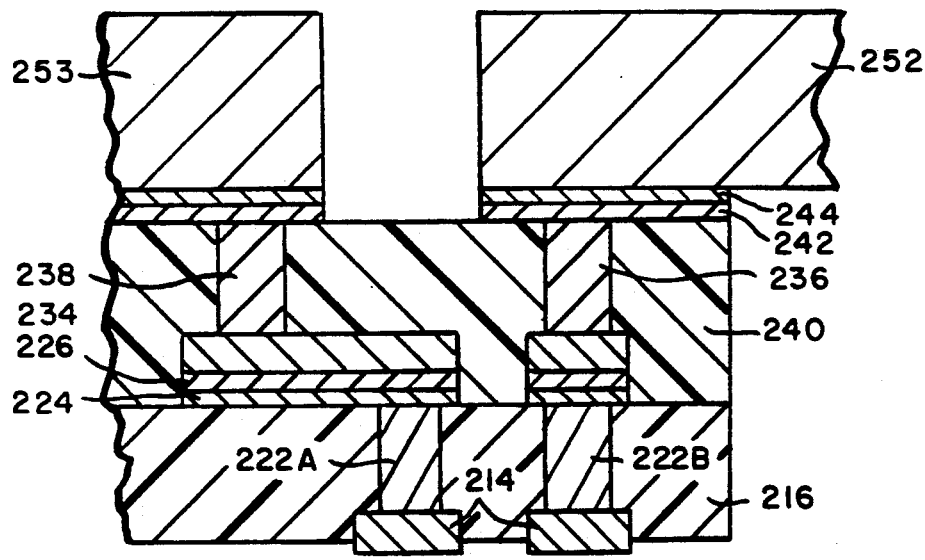
Figure 4F:
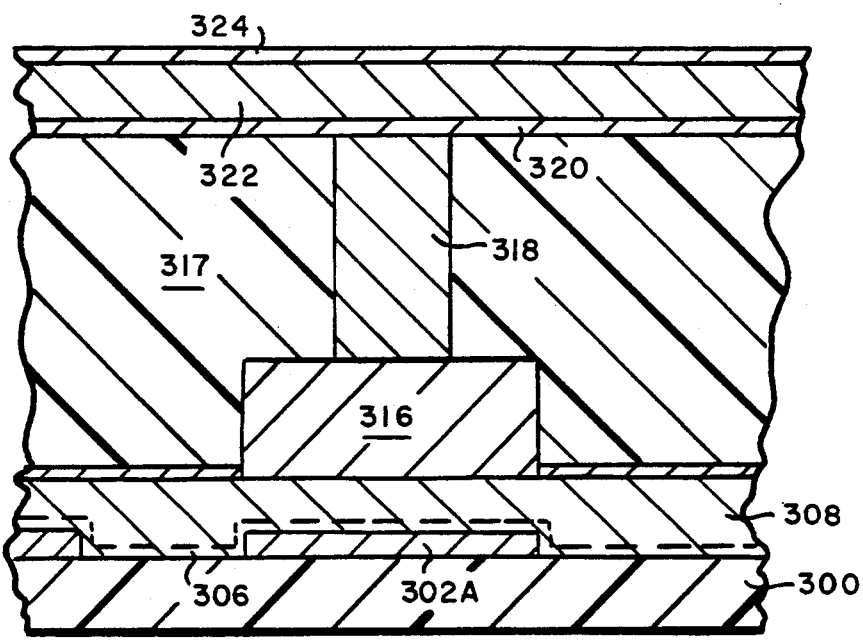

Using copper layer 308 as an electrode, a ground plane 316 is then plated up over portion 302A of layer 302, as in FIG. 4F, and the resist 312 is removed. A layer of polyimide 317 is applied and patterned, with vias such as via 318 being formed, using the same technique as was employed in the example of FIGS. 3A-3K. A three layer "sandwich" is then made from a 1000 angstrom layer of chromium, 320; a one $\mu$m layer of copper, 322; and a 1000 angstrom layer of chromium, 324. See FIG. 4F.

Additional layers are created on the structure in the same way layers were added on top of layer 228 in FIG. 3F.

After the interconnect structure of either implementation is complete, openings in the polyimide tape can be etched by any of a variety of methods: e.g., by using an already existing mask or by depositing and patterning a separate mask for example, already-patterned layer 302. Thus, this fabrication technique is particularly useful for creating a TAB structure such as appears in FIG. 5 via a top view. There, a personality window 550 is provided for bonding an integrated circuit chip. The chip will be wired to TAB fingers such as 551A-551L. The TAB fingers are supported by a polyimide support ring 552, with vias connecting to some TAB fingers and ground planes beneath selected TAB fingers. Exemplary vias (top view) are indicated at 558A, 558B, 558C and 558D; the ground planes are not illustrated. An excise window 554 encircles support ring 552 and the TAB fingers extend beyond the excise window to the TAB tape 556, where they may be connected to test pads (e.g., test pads 551A-551L or to other conductors.

The process and structure of FIGS. 4A-4F is quite similar to that of FIGS. 3A-3K, but they have certain additional advantages over the prior art. First, the plating electrode is a continuous layer of copper 1 $\mu$m thick, which will allow for the uniform plating of vias on the tape edges as well as on the ground plane. In the case of FIG. 3C, the thin chromium layer 202 may not conduct enough current to isolated ground planes, resulting in tremendous thickness variations in plated copper traces and then vias. Further, after the silicon is etched in the FIG. 4A-4F process, the copper is readily etched and then plasma etching will cut through the 1000 angstrom chromium layer and start etching through the polyimide tape.

Figure 5:
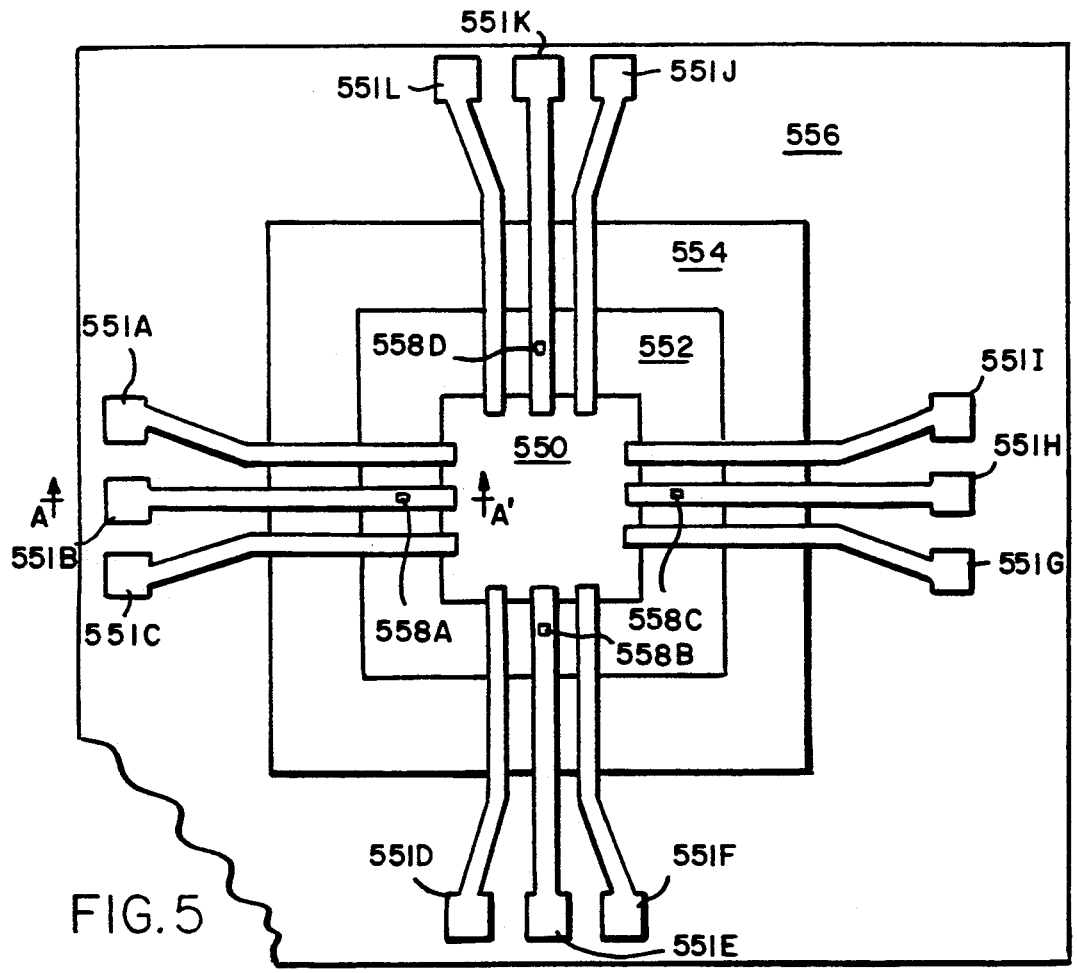

It will be understood that FIGS. 4A-4F represent the cross-sections of the structure of FIG. 5 at various stages of manufacture, such cross-sections being taken along a line such as A—A' in FIG. 5.

The foregoing sequences are exemplary only; other sequences can be used to yield similar structures.

The conductive traces in the resulting structure are not shown in any meaningful geometric configuration, as the drawing is intended to illustrate the fabrication process, not specific circuit applications. By appropriately designing the patterns of the conductors in the structure, it will be understood, a conductor may serve as a signal line, a power lead or a ground lead or ground plane. The ability to intersperse ground planes with signal-carrying leads provides a way to reduce crosstalk, provide lines of controlled impedances, and more densely pack leads in TAB structures than has previously been possible. In addition, because the conductors in the signal lines are not required to be the same thickness as the TAB fingers and the interlayer dielectrics can be thinner than presently-used TAB layers, the overall tape thickness remains managable for etching. For example, a three layer structure has been made with a total thickness of 50 $\mu$ (exclusive of TAB fingers), which is one-half to one-third as thick as the prior art; and thinner structures are possible. The various conductive layers, it should be understood, can be formed using either additive or substractive techniques, though only one approach is illustrated.

Figure 6:
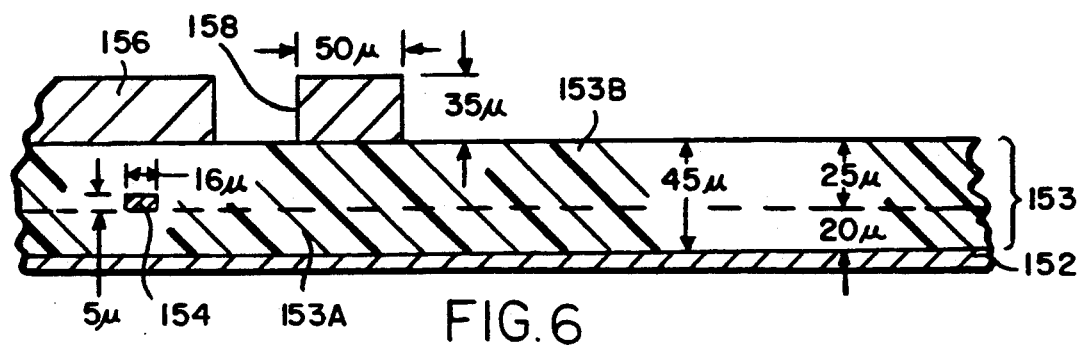
FIG. 6 to 5 is a diagrammatic illustration of a mixed-geometry structure fabricated according to the method of the invention, wherein a transmission line is shown within a TAB tape, as another example of the structures which may be fabricated.

An example of how the foregoing process can be used to create a mixed-geometry TAB structure is shown in FIG. 6.

That figure shows a TAB structure incorporating a microstrip TAB finger and signal transmission stripline. This structure could further be embedded in a larger multi-layer structure. A first conductive layer 152 is deposited. On top of the layer 152, a layer of dielectric 153A (e.g., 20 micron polyimide) is applied. A signal trace 154 of rectangular cross section 5 microns by 16 microns is built on the dielectric in the same way as conductive signal layers are built in the foregoing examples. After the stripline trace 154 is formed, another layer of dielectric 153B, of similar thickness, is applied. On the top side of the dielectric 153B, opposite layer 152, another metal plane 156 is plated. Next to the plane 156 is formed a TAB finger 158 of conventional dimensions (i.e., 35 microns by 50 microns). Not shown is the electrical contact to the conductor. Using for the dielectric a material having a dielectric constant of about 3.5 and a thickness of about 45 microns causes the impedance of the signal trace and the TAB leads both to be about 50 ohms. Thus, signal traces can be kept very small and only the upper level metal traces (i.e, power and ground leads and TAB fingers) need be the full, standard thickness.

The currently used TAB technologies would require dielectric thicknesses of 60-90 microns or greater for stripline and at least 130 $\mu$ for microstrip, by contrast, to provide a 50 ohm controlled impedance stripline of conventional dimensions of about 50 $\mu \times$ 35 $\mu$ in cross-section. It is much more difficult, and much slower, to etch such thick layers, much less to do so with the same precision. Moreover, the conventional TAB processes do not lend themselves to such mixed geometries.

The foregoing descriptions showed traces formed from continuous in plane metal. An alternate process would be to plate traces using, for example, metal 204 in FIG. 3H as the electrode.

Having thus described unique interconnect structures and methods of manufacturing those structures, various alterations, modifications and improvements of the above discussed implementations will readily occur to those skilled in the art. For example, other materials may be used, or thicknesses or other dimensions may differ. Layers may be added or omitted. Thus, these alterations, modifications and improvements are intended to be suggested though they are not expressly discussed, as the foregoing detailed description is presented by way of example only and is not intended to be limiting. Accordingly, the invention is defined only by the following claims and equivalents thereto.

What is claimed is:

1. A method of making an article for interconnecting a plurality of electrical elements, comprising the steps of:
   a. over a substrate, applying a first layer of a conductive material;
   b. over the first layer of conductive material, forming a first layer of dielectric material;
   c. in the first layer of dielectric, creating openings for vias in desired locations;
   d. using the first layer of conductive material an electrode, plating via posts into the via openings;
   e. depositing over the dielectric and the via posts a next layer of a conductive material;
   f. over the next layer of conductive material, forming a next, top layer of dielectric material;
   g. in the top layer of dielectric, creating openings for vias in desired locations;
   h. using the first layer of conductive material as an electrode, plating via posts into the via openings in the top layer of dielectric;
   i. for each subsequent layer of conductor desired, repeating steps e-h;
   j. removing the substrate;
   k. patterning the first layer of conductive material; and
   l. at least one of said layers of conductive material having conductive portions of substantially different thicknesses.

2. The method of claim 1 wherein the thickness of a thicker portion is suitable for use as a tape-automated bonding finger for connection to an integrated circuit bonding pad.

3. The method of claim 1 wherein at least one layer of conductive material is used as an etching mask to define a window.

4. The method of claim 1 wherein at least one layer of conductive material is used as a temporary conductive substrate for plating at least one level of vias and is then removed.

* * * * *